United States Patent [19]

Schedewie

[11] Patent Number: 4,626,907

[45] Date of Patent: Dec. 2, 1986

[54] METHOD AND APPARATUS FOR MUTUALLY ALIGNING OBJECTS

[75] Inventor: Franz Schedewie, Boeblingen, Fed. Rep. of Germany

[73] Assignee: International Business Machines Corporation, Armonk, N.Y.

[21] Appl. No.: 653,988

[22] Filed: Sep. 24, 1984

[30] Foreign Application Priority Data

Sep. 23, 1983 [EP] European Pat. Off. ........ 83109475.0

[51] Int. Cl.$^4$ ............................................. H04N 7/18
[52] U.S. Cl. ..................................... 358/101; 358/106; 358/107; 356/401
[58] Field of Search ....................... 358/101, 106, 107; 382/34, 43; 364/726, 487; 324/82; 328/133; 250/237 R, 237 G, 548, 550; 356/394, 398, 376, 400, 401, 356

[56] References Cited

U.S. PATENT DOCUMENTS

| | | | |
|---|---|---|---|
| 3,441,745 | 4/1969 | Reeves et al. | 324/82 |
| 3,867,038 | 2/1975 | Westell | 356/400 |
| 4,200,395 | 4/1980 | Smith et al. | 356/400 X |
| 4,253,112 | 2/1981 | Doemens | 358/101 |
| 4,298,285 | 11/1981 | Ito | 356/398 X |
| 4,408,885 | 10/1983 | Johannsmeier | 250/237 R X |
| 4,479,188 | 10/1984 | DeKeijzer | 364/726 X |
| 4,494,067 | 1/1985 | Barszczewski | 328/133 X |
| 4,549,084 | 10/1985 | Markle | 356/400 X |

*Primary Examiner*—Howard W. Britton
*Assistant Examiner*—Victor R. Kostak
*Attorney, Agent, or Firm*—Ronald L. Drumheller; John J. Goodwin

[57] ABSTRACT

Alignment marks in the form of periodic gratings are scanned by a TV camera, and the relative phase difference of the two scanning signals is electronically determined by digital or analog means. In the former case, a microprocessor computes at least the fundamental wave of the Fourier spectrum of each scanning signal, in order to compute relative alignment from the phase positions of the fundamental waves. If gratings with different grating periods are used on the objects to be mutually aligned, the superimposition of the computed fundamental waves leads to the generation of beats which constitute a highly sensitive measure of alignment errors. For an alternative analog evaluation, one of the scanning signals is delayed to compensate for the difference in scan timing before being fed with the other signal to a phase-sensitive amplifier for determining the phase difference.

8 Claims, 4 Drawing Figures

METHOD AND APPARATUS FOR MUTUALLY ALIGNING OBJECTS

DESCRIPTION

1. Technical Field

This invention relates to a method for mutually aligning objects by using periodically structured alignment patterns commonly known as optical gratings and to apparatus for its implementation. A preferred field of application is in the lithographic production of semiconductor circuits.

2. Background Art

For many manufacturing processes, two or more objects must be very accurately aligned relative to each other. An important example is in the lithographic processes used to fabricate microcircuits, wherein an exposure mask must be accurately aligned (positionally located) relative to a pattern on a semiconductor wafer. Since modern optical and electron beam exposure processes are suitable for producing structures, such as conductors, with dimensions in the micron ($\mu$m) range, such alignment must be accurate to with a fraction of a micron.

Many different types of optical alignment marks have been used, some with distinct symmetry characteristics or vernier scales in lieu of simple reticles, to permit readings as accurate as possible. However, even with highly accurate vernier gratings, prior art microscopic visual alignment methods do not provide the desired alignment precision because faulty readings and subjective assessments lead to errors anyway.

Many proposals have been made for using automatic and objective methods in place of manual visual alignment. In such methods, either the relative position of individual edges or the relative position of periodic structures is opto-electronically detected. In the former case, alignment marks on mask and wafer are imaged onto suitably positioned detectors, such as a TV camera, as described for example in European Pat. No. 51 567. The relative position of periodic alignment structures in the form of linear gratings may be detected by using the Moire' principle, wherein relative displacement of the gratings produces movement or phase shifting of a diffraction pattern. An example of an alignment method using gratings, wherein the phase shifting or movement of the diffraction pattern is electro-optically detected, is described in the European Patent Application No. 45 321.

However, all known previously proposed methods for aligning mask and wafer have serious disadvantages. If only individual edges are used, the accuracy of the alignment method is dependent upon the exact position of the individual edges used for the alignment. The position of these individual edges typically cannot be accurately defined, not only because of scanning errors, but also because of the typical edge profile. A typical edge does not have an abrupt step-shaped change in surface level or height, as would be ideal, but instead has a gradual change in surface level or height extending over some lateral distance. Accurate measurement of an edge position furthermore is relatively time consuming. Also, since the alignment mark edges of a wafer typically become covered with overlying layers of material (such as oxide or photoresist layers) during the process steps, the signal-to-noise ratio of an edge scan is also important.

When alignment structures in the form of gratings are used, all of the edges of the grating contribute to the alignment signal, so the signal-to-noise ratio is improved. However, in order to scan such an alignment pattern, a relatively large light spot is required, since the patterns on mask and wafer cover relatively large areas. In addition, installation of the necessary optical evaluation apparatus for the different diffraction orders in a conventional photolithographic system may present design problems.

It is an object of this invention to provide a method for rapidly and automatically aligning semiconductor wafers with respect to lithographic masks with a registration accuracy in the submicron range.

Another object is to implement this method with apparatus which is relatively inexpensive and suitable for installation in existing lithographic equipment.

DISCLOSURE OF THE INVENTION

In accordance with this invention, periodic structures in the form of linear optical gratings are used for alignment patterns. These gratings are arranged on the objects to be mutually aligned, such as a semiconductor wafer and a lithographic mask. The alignment patterns are then projected by suitable optical imaging apparatus onto a TV camera such that the gratings each are scanned by the electron beam of the TV camera in a direction perpendicular to the direction of the grating edges. Periodic electrical signals result from the scan of each grating image, the period of each signal corresponding with the period of the grating being scanned. The periodic signals are then electronically processed to determine the relative phase of the periodic signals. For this purpose, the periodic signals either are digitized and subjected to a fast Fourier analysis or are fed as analog signals to a phase-sensitive amplifier. In either case, the detected phase difference of the periodic signals is a measure of the relative position of the gratings and can be used as a control variable for automatic alignment.

The alignment patterns may have either the same or different grating periods. If the grating have different periods, beat signals will occur which are a highly sensitive alignment indicator.

The high accuracy of this method is based on the fact that a large number of edges contribute to the signal to be evaluated, thus compensating for errors in the position and profile of the individual edges. The signal-to-noise ratio and sensitivity are correspondingly high. Unlike other alignment methods using gratings, wherein coherent light from a laser is diffracted by the gratings and further optical apparatus (such as filters for selected diffraction orders, electro-optical phase compensators, etc.) is then used for evaluating the diffracted laser light, this method requires no coherent or laser light an no optical evaluation is done. With the subject method, the alignment marks may be illuminated in any fashion which results in suitable contrast for the TV camera, irrespective of light coherence. Unlike other prior art methods, the length of the individual grating edges with this method also may be very short (in extreme cases, equalling the width of one TV scan line), so that little space is used on a wafer or mask for the alignment marks. Another advantage of the subject method is that inclination of the alignment patterns with respect to the scanned TV line may be readily detected.

Little additional apparatus is required for implementing this method. Conventional lithographic apparatus often already includes a TV camera and the electronic components (analog-to-digital converters, data storage apparatus, phase-sensitive amplifiers, etc.) are all inexpensively available as standard components. The processing speed is high, particularly if processing occurs after the signals are converted to digital values, since fast algorithms for Fourier transformations (so-called fast Fourier transforms) are available and may be readily implemented on a standard microprocessor.

The subject method also may be used to test the quality of lithographic equipment; for this purpose, a mask pattern may be projected onto (and developed on) a pattern already existing on a wafer; subsequently the relative deviation of the pattern may be determined at different points in the visual field with the aid of the above described grating structures.

DESCRIPTION OF THE PREFERRED EMBODIMENTS

Figure 1:
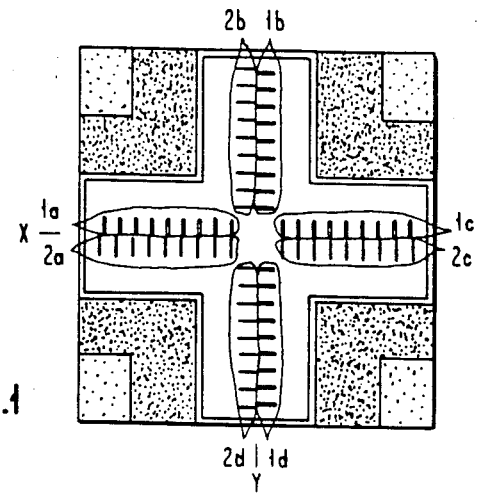
FIG. 1 shows an image of alignment marks on a wafer and mask in accordance with the present invention when the mask and wafer are in mutual alignment.

FIG. 1 shows alignment marks on a wafer and mask which have been made to coincide, i.e., the mask and wafer are aligned with each as viewed by an operator through a microscope. The alignment marks $1a$ to $1d$ of the mask $2a$ to $2d$ of the wafer each consist of periodically arranged linear marks with a mutual spacing of about 2.5 microns. In order to obtain a vernier effect during alignment, the spacing of the linear marks of the mask is chosen slightly smaller than that of the linear marks of the wafer. At the center of the cross there are no linear marks, so that a free space, say of a width G, exists in each of the X- and the Y- coordinate directions. When the alignment image shown in FIG. 1 is visually used for manual alignment by an operator, alignment accuracies of about 1/10th of the grating period (i.e., 0.25 micron) are obtained.

For convenience, the alignment image shown in FIG. 1 in many instances in not observed directly by an operator through a microscope but instead is viewed by a TV camera and reproduced on a monitor for observation by the operator. In such a set-up, the subject phase-sensitive electronic alignment method may be implemented by connecting the output of the TV camera with suitable electronic evaluation circuits, without interfering with the lithographic image itself.

For the purpose of the present invention, the periodic alignment patterns 1 and 2, respectively, shown in FIG. 1, which may be referred to as gratings, need not have different grating periods; nor need two gratings be provided in each direction which are separated from each other by a distance G. The subject alignment method only requires that the mask and wafer have at least one periodic grating for each direction in which alignment is to be effected. The usual individual edge marks known from the art are not suitable for this purpose.

Figure 2:
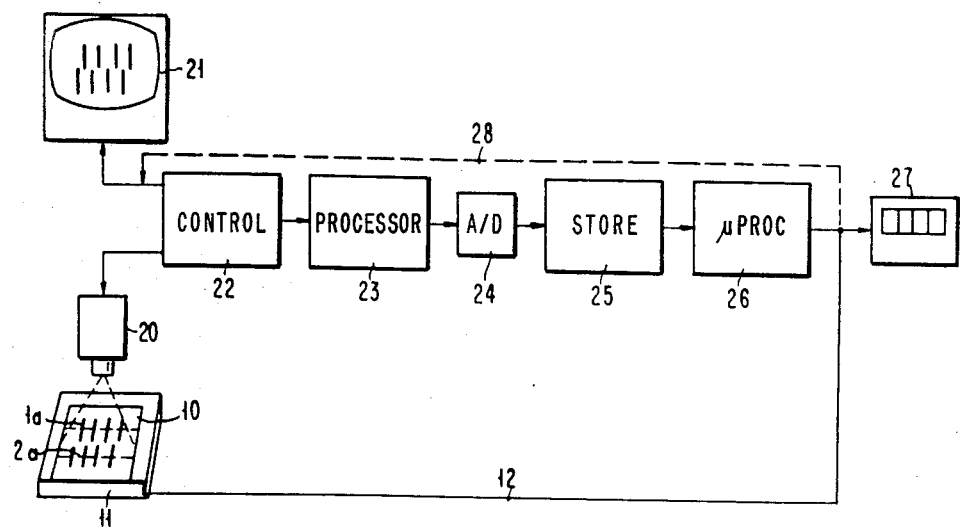
FIG. 2 is a block diagram of apparatus which may be used for determining the relative phase of the marks shown in FIG. 1 by digital means.

The alignment method in accordance with this invention will now be described by reference to the preferred embodiment shown in block diagram in FIG. 2. A portion of the alignment image shown in FIG. 1, image section 10 (shown as including only the gratings $1a$ and $2a$), is converted by the TV camera 20 and its associated camera control 22 into electrical signals and selectively reproduced on a monitor 21. The selection of the alignment image portion (image section 10) to be viewed by the TV camera can be done either manually, using monitor 21, or automatically, using simple image processing circuits 23 which respond to the periodic grating structure and which position the camera image accordingly. This will be described in further detail below.

If the TV camera is positioned such that its scanning lines cross the gratings $1a$, $2a$ perpendicular to the direction of the grating lines, one of the scanning lines is selected by circuit 23 for each of the gratings and transferred to analog-to-digital converter 24. The analog line signal for each grating then is stored as digital data in digital storage 25.

Even if the grating to be scanned is oriented such that it is scanned by the electron beam of the TV camera in a direction other than perpendicular to the grating lines, a periodic signal corresponding with the grating still may be obtained. In this situation, each of the TV scan lines is sampled as it passes through a narrow time window and the sampled values are stored. The position and size of the time window are chosen such that the window lies perpendicularly across the grating lines. The sampled values then correspond to a line lying perpendicularly across the grating being scanned. The sequence of stored sample values along the sampled line constitutes the periodic signal of the grating and may be digitally processed or converted to analog form for analog processing.

It should be apparent that not only these but also other signal processing techniques known to those of skill in this art may be used to derive periodic electronic signals from gratings viewed by a TV camera.

In accordance with this invention, the difference between the phase of each of the two signals derived from the periodic alignment structures must be determined and can be done using any known technique. This may be done, for example, in a microprocessor 26, by means of which the digital values corresponding to the signals are read from storage 25 and processed in accordance with a known algorithm (which will be described in detail below) to generate an output signal which corresponds to the phase or the phase difference and which may be displayed on a display unit 27. For symbolic phase representation, it is also possible to use the monitor 21 in lieu of the unit 27; in this case, the output of the microprocessor 26 would be connected to the monitor 21 via a line 28.

Figure 3:
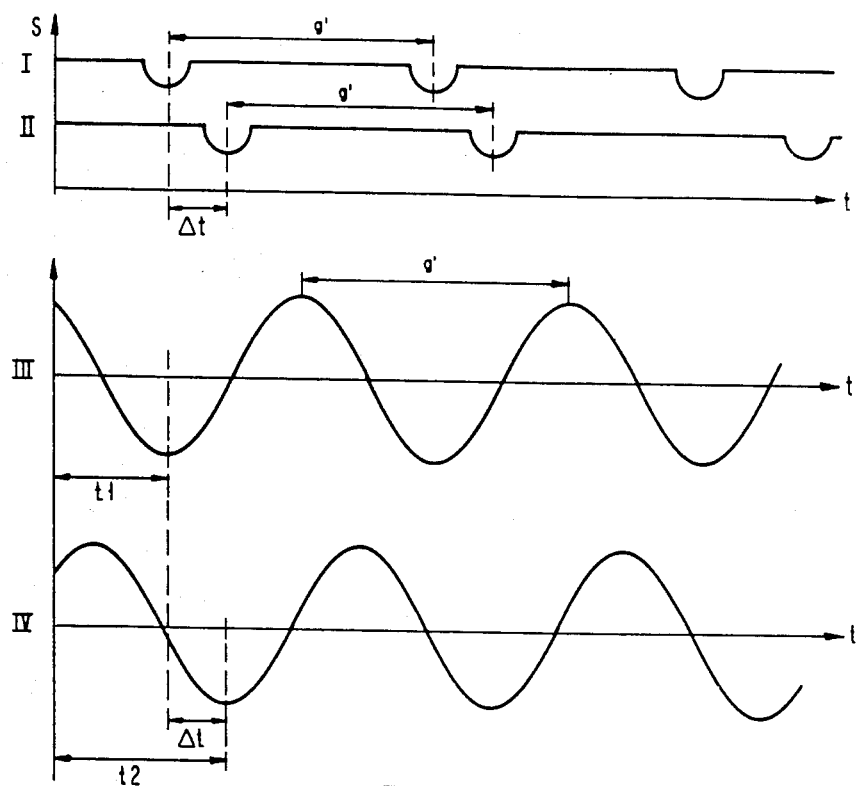
FIG. 3 is the time diagram of the signal trains which occur during the scanning of periodic alignment marks and the associated fundamental waves.

The electrical output signals occurring when the gratings $1a$, $2a$ are scanned by the TV camera 20 are shown in curves I and II of FIG. 3. It is assumed in this case that both gratings have the same grating constant g (and/or g') in the time diagram, with $g' = g/v$, where v is the scanning speed of the electron beam of the TV camera) and are displaced by $\Delta x$ relative to each other, which corresponds to a delay $\Delta t$ in the time diagram. For accurate alignment, the value $\Delta t$ for the sampled signals must be determined as accurately as possible, even though the signals derived from the individual grating edges are distorted and blurred by a plurality of effects, so that the accurate position of the individual minima cannot be accurately determined. In accordance with this invention, however, the inaccuracies that inevitably occur when individual edges are scanned are compensated for by using the totality of the edges for electronic evaluation. In the most general form of this invention, a fundamental wave (or a fundamental frequency) is derived from each of the periodic signals I, II (FIG. 3) by computational Fourier transformation and the phase position of each fundamental wave is then determined with respect to an arbitrary reference point. The fundamental waves associated with the signal trains I, II, which are determined by Fourier transformation, are schematically represented in the curves III, IV respectively. According to the known Fourier theories, arbitrary periodical signal trains may be expanded into a plurality of sine waves with ascending frequencies. The fundamental (or lowest frequency) wave constitutes an ideal sine wave with the period $g_1$, which is a function of the totality of the periodic alignment patterns and which has a phase (e.g., the distance of the first minimum from the Y-axis) that can be very accurately determined. The phase difference of the two fundamental waves thus is $$\Delta\Phi = \Phi_2 - \Phi_1 = \frac{2\pi}{g}(t_2 - t_1).$$

The reference point may be, for example, the start of the TV line. Since phases $\phi_1$ and $\phi_2$ can only be determined within a multiple of $2\phi$ and $t_1 = \frac{1}{2}\pi \cdot \phi_1 \cdot g'$, it is essential that the gratings on mask and wafer be preliminarily registered such that the deviation from the final desired position is less than $g/2$.

The above-described harmonic analysis of the sampling signals may also be applied if the gratings on mask and wafer have different grating periods; this may even be advantageous, since in such a case the two electronically determined fundamental frequencies may be superimposed upon each other, forming beats which, if the two grating periods are suitably selected, yield a unique alignment signal even with gratings that have only been coarsely preliminarily aligned. Since the resulting period of the beat for two superimposed gratings with the respective grating periods $g_1$ and $g_2$ is proportional to the value $1/(g_2-g_1)$, the individual grating periods may be selected such that only one maximum of the fundamental wave of the superimposition signal will occur within the full range of longitudinal displacements for the two individual gratings. The position of this maximum is highly sensitive to displacements of the individual gratings, thus providing a very accurate measure of the ideal alignment position. The position of this maximum is computed by the microprocessor 26 which also effects the analog conversion.

A further embodiment of the harmonic analysis applies to the case illustrated in FIG. 1, where two partial gratings, separated by a gap, are provided in each coordinate direction. Since such periodic structures also have a unique Fourier spectrum, the preceding explanations also apply in this case. The gap between the two partial gratings is mathematically represented merely by an additional fixed phase difference $2\pi G/g$. Accordingly, the resulting total wave, for example for a grating with a grating period $g_1$, arranged on the mask, may be expressed as follows:

$$\sin(2\pi x/g_1 + \phi_1) + \sin(2\pi x/g_1 + \phi_1 + 2\pi G/g_1) = 2$$
$$\sin(2\pi x/g_1 + \phi_1 + \pi G/g_1) \cdot \cos(\pi G/g_1).$$

This analogously applies also to the fundamental wave of the alignment pattern on the wafer with a grating period $g_2$:

$$2\sin(2\pi x/g_2 + \phi_2 + \pi G/g_2) \cdot \cos(\pi G/g_2).$$

Thus, the relative phases of these two waves are $$\phi_I = \phi_1 + \pi G/g_1$$

and $$\phi_{II} = \phi_2 + \pi G/g_2$$

so that the resulting waves, except for the constant cosine factor, may be represented as $$\sin(2\pi x/g_1 + \phi_I)$$

and $$\sin(2\pi x/g_2 + \pi_{II}).$$

The criterion for complete alignment in this case is that the phases of the fundamental waves of both patterns match at a given point; with respect to the alignment pattern shown in FIG. 1, visual alignment exists when the internal grating edges are made to coincide; alignment by harmonic analysis exists when there is a phase match of the fundamental waves at the right end of the left alignment pattern and at the left end of the right alignment pattern. For the superimposition waves, alignment exists if the superimposed waves in the center of the gap G have the same phase. If, as previously described, the location of the phase match of the superimposition waves is symbolically displayed on the monitor, for example, by an inserted light or dark perpendicular marker line, this marker line extends through the very center of the gap G upon completion of alignment (phase match). The marker line moves across the entire longitudinal dimension of the alignment pattern if one of the gratings is displaced by a linear distance $g_1$ or $g_2$. The actual relative displacement is greatly amplified by the movement of the marker line and thus may be accurately read.

Harmonic superimposition also may be used for periodic alignment patterns which are not arranged closely adjacent to each other but which for alignment instead are projected on top of each other. Such optically superimposed gratings are used, for instance, also for visual alignment, for which purpose one of the gratings is shifted until it coincides with the gaps of the other grating. In this case, the image of the superimposition grating is scanned by the TV camera for, and subsequently the combined signal is subjected to, harmonic analysis. This approach is in contrast with the above-described generation of beat signals where the two gratings are separately scanned, and superimposition of the fundamental waves is effected only during digital processing.

Harmonic analysis of scanned superimposition gratings determines the amplitude ratio of the different orders in the respective Fourier frequency spectrum as a criterion for the accuracy of superimposition. The amplitudes of the respective orders depend, as is known, on the ratio of the grating period and the relative displacement of the two gratings. For each ratio of the grating periods, it is possible to computationally determine which Fourier orders have the lowest and the highest amplitude, respectively, at ideal alignment. Alignment is effected when the determined orders in the frequency spectrum have reached the maximum and the minimum values, respectively.

If, for example, two gratings with identical periods are aligned with respect to each other such that the lines of one grating fall within the gaps of the other, then the amplitude of the fundamental wave (with the grating period g) and the amplitude of the second harmonic (with the grating period g/3) in the frequency spectrum will reach a minimum, while the first harmonic (with the grating period g/2) has a maximum amplitude. This is apparent, since the two superimposed gratings may be considered as a new grating with half the grating period.

The expense involved in computing the frequency components of the scanned pattern with the aid of Fourier transformation is reasonable with currently available equipment; fast computational algorithms (so-called FFT=fast Fourier transform) are available in particular, which permit real-time calculation of the Fourier spectrum with only most computing power. The computations required for this purpose may be readily performed by one of the currently available microprocessors implemented on an integrated circuit chip. The capacity of the digital storage required for the digitized signals also poses no technological or financial problems.

The expenses involved in computing the respective phases can be reduced still further if the alignment patterns are subjected to certain constraints which are not detrimental in practice. If the alignment patterns used are invariably gratings with the same grating constant g, the fundamental frequency of the grating need no longer be determined. In such cases, it is sufficient for phase determination to sample the scanning signal point-by-point. According to the sampling theorem, only three sampling points are needed for each distance corresponding to a grating period. For this purpose, the microprocessor 26 addresses the storage 25 in identical steps, deriving the desired phase from the total number of the sampled values after averaging.

Figure 4:
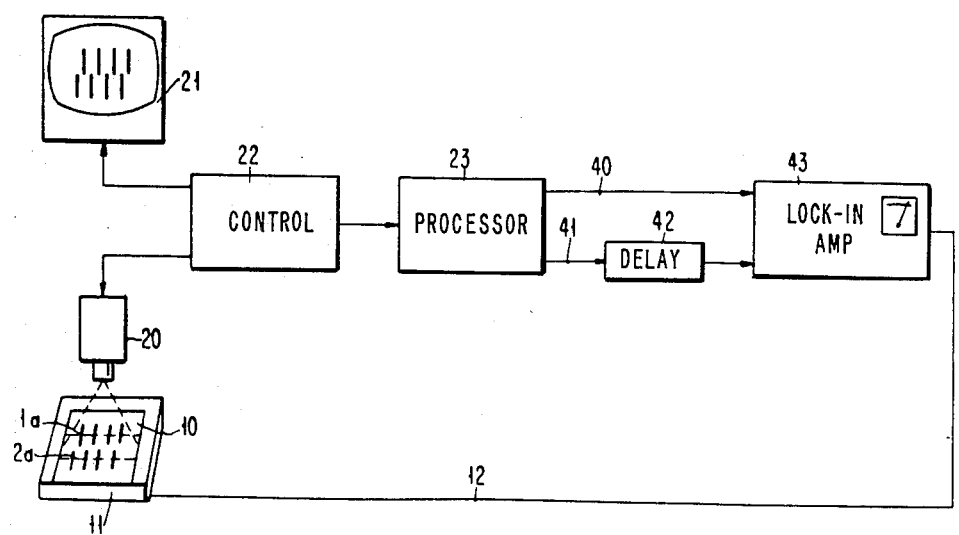
FIG. 4 is a block diagram of apparatus which may be used for determining the relative phase of the marks shown in FIG. 1 by analog means.

FIG. 4 is a block diagram of a further apparatus for phase-sensitive alignment, comprising analog evaluation means. The left part of this apparatus corresponds to that of FIG. 2. The circuit 23 for line selection has, however, two parallel outputs with conductors 40 and 41 carrying in each case the analog signal of the scanned alignment patterns 1a and 2a. Since one of these lines is scanned earlier than the other, the conductor for the line that is scanned first includes a delay means 42 compensating for the time loss of the line that is scanned later. The two signals aligned to each other with respect to the different sampling times are then fed to the inputs of a phase-sensitive detector circuit 43, which is known in the art as a lock-in amplifier, for example. The output signal of such a phase-sensitive detector circuit indicates the time (phase) difference of the two input signals. For the present application, this output signal thus constitutes a direct measure of the accuracy of the mutual alignment of mask and wafer. The delay means used for the analog signal may be, for example, delay lines with a movable tap, as are known from the art. Since phase-sensitive detector means are relatively slow in comparison with the frequency of the scanning signal, averaging is also effected in this case by using the signals of several grating edges, thus obtaining a higher alignment accuracy than with simple single edge measurements.

The image section 10 (for each of the two coordinate directions) may be automatically selected with the aid of methods known from pattern recognition. It is also possible to include analog or digital filters responding to the known spatial frequency of the gratings. Such filters may be included, for example, in the circuit 23 for line selection. A further approach would be to digitize larger portions of the visual field of the TV tube and to provide suitable algorithms for pattern recognition in the microprocessor 26. The image of the alignment patterns may also be manually aligned to selected scanning lines of the TV camera, using a monitor! in this case, the selected scanning lines emit the periodic output signal through electronic circuits.

If the alignment signal is to be used in a control loop for fully automatic alignment, this may be done with the aid of an output line 12 connected to suitable mechanical drive means for an X/Y table 11.

Electronic phase determination of one or several alignment marks designed as gratings permits readily adapting to different types and structures of alignment marks. The optical system of the lithographic set-up need not be interfered with; on the other hand, in certain cases, it may be advantageous to modify the illumination of the marks so that an optimum signal is obtained at the output of the TV camera. Alignment between the longitudinal direction of the mark and the scanning direction of the TV camera is not critical, since angular misalignment may be readily detected by scanning the upper and/or the lower part of the grating twice and then correcting by electronic means.

Having thus described my invention, what I claim as new, and desire to secure by Letters Patent is:

1. A method for mutually aligning two objects each of which are provided with a periodically structured alignment pattern, characterized in including the steps of scanning the alignment patterns on both objects, converting said scanned alignment patterns into two periodic electrical signals, determining the relative phase difference of both said two periodic electric signals as a measure of alignment and digitizing and computing the Fourier components of said two periodic electrical signals.

2. A method as defined in claim 1, characterized in that each of said periodic alignment patterns have the same period.

3. A method as defined in claim 1, characterized in that the said periodic alignment patterns have different periods.

4. A method as defined in claim 1, characterized in the step of electronically superimposing the said fundamental Fourier components of said periodic electrical signals upon each other wherein the resulting signals serve as a measure of alignment.

5. A method as defined in claim 1, characterized in the step of sampling said periodic electrical signals at at least three points in each period.

6. Apparatus for mutually aligning two objects each of which are provided with periodically structured alignment patterns comprising means for scanning the alignment patterns by a TV camera to produce periodic scanning signals which is followed by means connected to said scanning means for causing said periodic scanning signals of said alignment patterns to be filtered out and emitted as analog output signals, digitizing means for digitizing said analog output signs and means for storing said digitized output signal in a digital storage which is accessed by a digital processor.

7. Apparatus as defined in claim 6, further including means for delaying said periodic scanning signals of said alignment patterns, and a phase-sensitive amplifier means responsive to said analog output signals.

8. Apparatus as defined in claim 6 further including a monitor connected to the said TV camera for visually displaying a signal indicative of said alignment patterns.

* * * * *